United States Patent
Bombillon et al.

(10) Patent No.: US 12,012,657 B2
(45) Date of Patent: Jun. 18, 2024

(54) PART COATED WITH A HYDROGENATED AMORPHOUS CARBON COATING ON AN UNDERCOAT COMPRISING CHROMIUM, CARBON AND SILICON

(71) Applicant: HYDROMECANIQUE ET FROTTEMENT, Andrézieux Bouthéon (FR)

(72) Inventors: Laurent Bombillon, Andrézieux Bouthéon (FR); Fabrice Prost, Saint-Etienne (FR)

(73) Assignee: HYDROMECANIQUE ET FROTTEMENT, Andrézieux Bouthéon (FR)

( * ) Notice: Subject to any disclaimer, the term of this patent is extended or adjusted under 35 U.S.C. 154(b) by 601 days.

(21) Appl. No.: 17/252,615

(22) PCT Filed: Jun. 17, 2019

(86) PCT No.: PCT/FR2019/051462
§ 371 (c)(1),
(2) Date: Dec. 15, 2020

(87) PCT Pub. No.: WO2019/243720
PCT Pub. Date: Dec. 26, 2019

(65) Prior Publication Data
US 2021/0254220 A1    Aug. 19, 2021

(30) Foreign Application Priority Data
Jun. 18, 2018   (FR) ........................ 1855319

(51) Int. Cl.
| | | |
|---|---|---|
| *B32B 9/00* | (2006.01) | |
| *C23C 16/02* | (2006.01) | |
| *C23C 16/26* | (2006.01) | |
| *C23C 16/32* | (2006.01) | |
| *C23C 28/00* | (2006.01) | |
| *C23C 28/04* | (2006.01) | |
| *F16J 9/26* | (2006.01) | |

(52) U.S. Cl.
CPC ........ C23C 28/046 (2013.01); C23C 16/0272 (2013.01); C23C 16/26 (2013.01); C23C 16/32 (2013.01); C23C 28/048 (2013.01); C23C 28/34 (2013.01); F16J 9/26 (2013.01)

(58) Field of Classification Search
CPC ....... Y10T 428/30; B32B 9/007; C23C 16/26; C23C 16/32; B82Y 30/00

USPC .......................................... 428/408
See application file for complete search history.

(56) References Cited

U.S. PATENT DOCUMENTS

| | | | |
|---|---|---|---|
| 9,034,525 B2* | 5/2015 | Babic .................. | C04B 35/6264 429/321 |
| 2004/0038033 A1 | 2/2004 | Massler et al. | |
| 2010/0206553 A1* | 8/2010 | Bailey ................. | E21B 17/1085 166/243 |
| 2017/0122249 A1 | 5/2017 | Procopio et al. | |

FOREIGN PATENT DOCUMENTS

| | | |
|---|---|---|
| CN | 104271802 A | 1/2015 |
| EP | 2 103 711 | 9/2009 |
| FR | 2 922 358 | 4/2009 |
| FR | 2 975 404 | 11/2012 |
| FR | 2 995 493 | 3/2014 |
| FR | 3 011 305 | 4/2015 |
| JP | 2001-269938 | 10/2001 |
| JP | 2007-314838 A | 12/2007 |
| JP | 2016-084516 A | 5/2016 |

OTHER PUBLICATIONS

International Search Report for PCT/FR2019/051462 mailed Sep. 23, 2019, 5 pages.
Written Opinion of the ISA for PCT/FR2019/051462 mailed Sep. 23, 2019, 5 pages.
Office Action issued in Chinese Patent Application No. 201980041073.6 dated Jul. 22, 2022.
Office Action issued in Japanese Patent Application No. 2020-560146 dated Mar. 30, 2023.

* cited by examiner

*Primary Examiner* — Daniel H Miller
(74) *Attorney, Agent, or Firm* — NIXON & VANDERHYE

(57) ABSTRACT

Disclosed is a part including a metal substrate, a non-hydrogenated amorphous ta-C or aC carbon coating that coats the substrate, and an undercoat which is based on chromium (Cr), carbon (C) and silicon (Si) and is disposed between the metal substrate and the amorphous carbon coating and to which the amorphous carbon coating is applied, characterized in that the undercoat included, at its interface with the amorphous carbon coating, a ratio of silicon in atomic percent to chromium in atomic percent (Si/Cr) of 0.35 to 0.60, and a ratio of carbon in atomic percent to silicon in atomic percent (C/Si) of 2.5 to 3.5.

20 Claims, No Drawings

PART COATED WITH A HYDROGENATED AMORPHOUS CARBON COATING ON AN UNDERCOAT COMPRISING CHROMIUM, CARBON AND SILICON

This application is the U.S. national phase of International Application No. PCT/FR2019/051462 filed Jun. 17, 2019 which designated the U.S. and claims priority to FR Patent Application No. 1855319 filed Jun. 18, 2018, the entire contents of each of which are hereby incorporated by reference.

BACKGROUND OF THE INVENTION

Field of the Invention

The present invention concerns a coated part comprising a metal substrate coated with a sub-layer and with a coating of hydrogenated amorphous carbon, the latter being deposited on the sub-layer comprising chromium, carbon and silicon.

Description of the Related Art

The parts considered here, comprising a coating, are for example friction members for the automotive, aeronautical or for instance space sectors. In the automotive field, they are for example distribution parts such as finger followers, tappets or for instance cams to reduce the friction between those parts. They may also be piston pins, to reduce the wear thereof and protect the surfaces against dragging.

A coating as described here may also apply to components such as piston rings, piston skirts, liners.

In the preceding non-limiting examples, the coatings are often required to operate in a lubricated environment.

Naturally, coatings of amorphous carbon, whether or not hydrogenated, have multiple applications which are not limited to components for the automotive, aeronautical or space industries. Guiding or sliding members, for example such as molds in the plastics industry, may also be coated with such a coating to minimize wear and friction without lubrication.

Coatings of amorphous carbon are commonly called "DLC" (standing for "Diamond Like Carbon"). They designate carbon-based materials generally obtained in the form of a thin layer and by vacuum deposition technologies.

These coatings may for example be classified into two families: those comprising hydrogen (H) and those without hydrogen.

Among the coatings with hydrogen, DLC coatings of high industrial interest are:
  "a-C:H" coatings ("a-C:H" standing for "hydrogenated amorphous carbon"). These coatings are generally produced by vapor phase chemical deposition assisted by plasma of a carbon-based gaseous precursor (which is for example acetylene ($C_2H_2$)).

Among the coatings without hydrogen, DLC coatings of high industrial interest are:
  "a-C" coatings ("a-C" standing for "amorphous carbon"), which are generally produced by magnetron sputtering of a graphite target.
  And, especially, "ta-C" coatings ("ta-C" standing for "tetrahedral amorphous carbon"), which are generally produced by arc evaporation of a graphite target.

The aforementioned three types of coating are thus obtained by a different technology.

Furthermore, currently, for each type of DLC coating such as the aforementioned (formed with different technologies, as illustrated above), it is frequently necessary to employ a specific sub-layer in order for the coating to adhere to a given substrate.

In the case of hydrogenated DLC coatings, or a-C:H in particular, there exist different variants of deposition technologies to produce these coatings based on the dissociation of hydrocarbon gas. Historically, one of the processes used to deposit hydrogenated DLCs is described in document FR 2 922 358. This document concerns a method of surface treatment of a part by means of plasma elemental sources by electron cyclotron resonance. This method gives DLC coatings of satisfactory quality.

However, in the interest of economic competitiveness, it is desirable to advance the technology to obtain more effective methods that are thus more competitive.

To that end, for example, document FR 2 995 493 describes a more effective device which, among other things, enables a better-adapted transfer of the plasma to the parts, such that the speed of DLC deposition is doubled. For this, the deposition device comprises a plasma source the use of which is very well-adapted to produce DLC coatings such as those described in document FR 2 975 404 (and also certain variants of that coating including beforehand in addition, a layer of chromium Core, or a layer of chromium and a layer of chromium nitride CrN).

However, the coatings, comprising a layer of Cr followed by a layer of CrN then a transition layer of hydrogenated DLC doped with silicon (a-C:H:Si) and lastly a coating of hydrogenated DLC (a-C:H) as described in document FR 3 011 305, fail to be deposited with satisfactory characteristics using the device described in document FR 2 995 493. In particular, such a coating produced with such a source often exhibits poor performance when the coating is indented using the Rockwell method under 150 kg (kilograms) to evaluate adhesion according to the VDI3198 standard. At minimum, the indentation is rated HF3 according to that VDI3198 standard (this being considered rather poor; a good result is rated HF1 and the worst is rated HF6). The observation of the indentation a few hours after it was made shows spontaneous degradation of the indentation rating towards HF6.

To mitigate this problem, the method parameters were adjusted, in particular to reduce the stresses to which the transition layer of silicon-doped hydrogenated DLC (a-C:H:Si) is subjected, in particular by reducing the flux of ions which the plasma source sends at the parts via the reduction of the power applied to the plasma source and by reducing the energy of the ions via the bias voltage. The improvements observed do not suffice to obtain a coating with a satisfactory Rockwell indentation. The plasma source is so effective that it is not possible to make the deposition conditions sufficiently gentle for the layer of "a-C:H:Si".

SUMMARY OF THE INVENTION

Thus, the present invention is directed to overcoming the aforesaid drawbacks at least partly.

In particular, one object of the invention is to provide a part, comprising a hydrogenated DLC coating, in particular of a-C:H type, which makes it possible to cope with the characteristics of the plasma of the source described in document FR 2 995 493.

The present invention is thus directed to providing a part, with a hydrogenated DLC coating, in particular of a-C:H type, that makes it possible to obtain good performance in the adhesion test of the DLC coating by Rockwell C indentation.

DESCRIPTION OF THE PREFERRED EMBODIMENTS

To that end, according to a first aspect there is provided a part comprising a metal substrate, a hydrogenated amorphous carbon coating, of a-C:H type, coating the substrate, and a sub-layer based on chromium (Cr), carbon (C) and silicon (Si) disposed between the metal substrate and the amorphous carbon coating and on which the amorphous carbon coating is applied, characterized in that the sub-layer comprises the following atomic ratios at its interface with the amorphous carbon coating (that is to say at the surface of the sub-layer):
A ratio between the silicon content and the chromium content (Si/Cr) comprised between 0.35 and 0.60, and
A ratio between the carbon content and the silicon content (Si/Cr) comprised between 2.5 and 3.5.

Such a sub-layer composition has contents which are for example measurable by EDX analysis (EDX standing for (Energy Dispersive X-Ray Spectrometry) in a scanning electron microscope (SEM) or by GDOES (Glow Discharge Optical Emission Spectroscopy).

It turns out that such a sub-layer makes it possible to obtain a coating adhesion result rated HF1, that is stable over time.

What is more, such a sub-layer has also proved particularly advantageous for a non-hydrogenated DLC coating, in particular of ta-C type, or even a-C type.

Such a sub-layer then takes the form of a gradient layer having a composition based mainly on chromium (Cr), silicon (Si) and carbon (C).

The sub-layer becomes progressively enriched (on going from the substrate towards the DLC coating) in silicon (Si) and in carbon (C), to attain a composition enabling the adhesion of the coating, as referred to above.

In a particular example, the ratio between the silicon content and the chromium content (Si/Cr) of the sub-layer in the vicinity of the interface with the DLC is comprised between 0.38 and 0.60, or even between 0.40 and 0.60.

In a particular example, the ratio between the carbon content and the silicon content (C/Si) of the sub-layer in the vicinity of the interface with the DLC is comprised between 2.8 and 3.2, or even between 2.9 and 3.1.

The sub-layer may possibly comprise nitrogen (N). This is particularly advantageous if the part further comprises a layer of chromium nitride, as described below.

Thus, in an advantageous example embodiment, the sub-layer further comprises atoms of nitrogen (N), a ratio between the nitrogen content and the chromium content (N/Cr) being less than 0.70 in the vicinity of the interface with the DLC, that is to say at the interface between the sub-layer and the amorphous carbon coating.

According to advantageous examples, the ratio between the nitrogen content and the chromium content (N/Cr) is comprised between 0.26 and 0.70, or even between 0.29 and 0.67, or even between 0.35 and 0.65, at the interface between the sub-layer and the amorphous carbon coating.

According to advantageous examples, the ratio between the silicon content and the chromium content (Si/Cr) is comprised between 0.40 and 0.55, or even between 0.45 and 0.55, at the interface between the sub-layer and the amorphous carbon coating.

In a favored example, the sub-layer, with or without nitrogen, has a thickness of a few tenths of a micrometer; preferably a thickness equal to or less than approximately 1.1 µm, for example comprised between approximately 0.2 µm and 1.1 µm, preferably comprised between approximately 0.3 µm and 0.6 µm.

As a matter of fact, in practice, beyond 1.1 µm a column-like development occurs, which is detrimental to the holding of the sub-layer, and below 0.2 µm, the sub-layer does not produce its effect of adaptation layer.

The amorphous carbon coating has for example a thickness equal to or greater than approximately 0.3 µm, or even than approximately 0.5 µm, or even than approximately 1 µm, or even than 1.5 µm.

The amorphous carbon coating has for example a thickness equal to or less than approximately 10 µm, or even than 8 µm, or possibly even than approximately 3.5 µm.

The amorphous carbon coating has for example a thickness comprised between approximately 1.5 µm and approximately 3.5 µm, but may attain 8 µm when such a coating is applied to a piston ring for example.

The metal substrate is for example of steel or other metal alloys.

In advantageous example embodiments, the part further comprises a chromium-based layer, deposited on the substrate and on which the sub-layer is formed.

The chromium-based layer is for example a layer of chromium (Cr) and/or a layer of chromium nitride, for example CrN or $Cr_2N$, or any intermediate compound.

Preferably, the part comprises a layer of chromium (Cr), or a layer of chromium (Cr) followed by a layer of chromium nitride (for example CrN or $Cr_2N$, or any intermediate compound).

Preferably, the chromium-based layer has a thickness of a few tenths of a micrometer, preferably a thickness equal to or less than approximately 1 µm, or even 0.6 µm, for example comprised between approximately 0.1 µm and 0.5 µm, or even between approximately 0.3 µm and 0.5 µm.

Moreover, it has turned out that the sub-layer could have a thickness less than the sub-layers of the prior art, thereby making it possible to increase the thickness of the DLC for a same total thickness of the coatings (that is to say taking into consideration the thicknesses of the DLC, of the sub-layer and of the chromium based layer as the case may be).

In other words, a ratio between the thickness of the amorphous carbon coating and the thickness of the sub-layer, or even taking into account the thickness of the chromium-based layer as the case may be (th. DLC/th. sub-layer, or th. DLC/(th. sub-layer+chromium-based layer)), may be increased. Such a ratio is for example comprised between approximately 2.2 and approximately 12, or even between approximately 2.25 and approximately 11.5, or even between approximately 2.25 and 7.5, or even between approximately 2.27 and approximately 7.25.

For example, a ratio between the thickness of the amorphous carbon coating and the total thickness of the coatings (that is to say here the sum of the thicknesses of the amorphous carbon coating, of the sub-layer and of the chromium-based layer as the case may be), i.e. [th. DLC/(th. DLC+th. sub-layer+th. chromium-based layer)] is comprised between approximately 0.65 and approximately 0.9, or even between approximately 0.69 and approximately 0.88.

For example, the total thickness of the coatings (i.e. the sums of the thicknesses of the amorphous carbon coating, of the sub-layer and of the chromium-based layer as the case may be) is comprised between approximately 1.5 µm and approximately 4.9 μm, preferably between approximately 1.8 μm and approximately 4.6 μm.

The table below presents different tests, numbered 1 to 15. The atomic ratios, measured by EDX, are those of the sub-layer in the vicinity of the interface with the coating (bearing in mind that the sub-layer exhibits a composition gradient, the composition aimed at is that towards which it tends at the interface with the DLC coating).

| No. | Th. of the Cr-based layer (μm) | DLC th. (μm) | Total sub-layer th. (including the Cr-based layer) (μm) | Total th. (DLC + sub-layer + Cr layer) (μm) | DLC th./ tot. sub-layer th. | DLC th./ total th. | Si/Cr | C/Si | N/Cr | Adh. HRC |
|---|---|---|---|---|---|---|---|---|---|---|
| 1 | 0 | 3 | 0.5 | 3.5 | 6.00 | 0.86 | 0.20 | 3.00 | 0.00 | no |
| 2 | 0 | 2.5 | 0.6 | 3.1 | 4.17 | 0.81 | 0.30 | 2.92 | 0.00 | no |
| 3 | 0 | 2.2 | 0.4 | 2.6 | 5.50 | 0.85 | 0.29 | 2.93 | 0.00 | no |
| 4 | 0 | 2.9 | 0.4 | 3.3 | 7.25 | 0.88 | 0.42 | 3.00 | 0.00 | yes |
| 5 | 0 | 2.5 | 0.8 | 3.3 | 3.13 | 0.76 | 0.50 | 3.06 | 0.00 | yes |
| 6 | 0 | 2.4 | 0.6 | 3 | 4.00 | 0.80 | 0.60 | 2.94 | 0.00 | yes |
| 7 | 0 | 2.2 | 0.7 | 2.9 | 3.14 | 0.76 | 0.80 | 2.95 | 0.00 | no |
| 8 | 0 | 2.7 | 0.5 | 3.2 | 5.40 | 0.84 | 1.10 | 3.00 | 0.00 | no |
| 9 | 0.3 | 2.7 | 0.9 | 3.6 | 3.00 | 0.75 | 0.55 | 3.00 | 0.40 | yes |
| 10 | 0.5 | 2.5 | 1.1 | 3.6 | 2.27 | 0.69 | 0.48 | 2.92 | 0.65 | yes |
| 11 | 0.3 | 2.4 | 0.7 | 3.1 | 3.43 | 0.77 | 0.30 | 3.00 | 1.00 | no |
| 12 | 0.4 | 2.3 | 0.6 | 2.9 | 3.83 | 0.79 | 0.32 | 2.92 | 0.30 | no |
| 13 | 0.3 | 3 | 1 | 4 | 3.00 | 0.75 | 0.45 | 2.93 | 0.35 | yes |
| 14 | 0 | 3.5 | 1.1 | 4.6 | 3.18 | 0.76 | 0.50 | 3.00 | 0.00 | yes |
| 15 | 0 | 1.5 | 0.3 | 1.8 | 5.00 | 0.83 | 0.48 | 3.10 | 0.00 | yes |

In all the tests, it is observed that the adhesion behavior of the DLC on the sub-layer is linked to the composition of the surface of the sub-layer.

The presence of nitrogen at the surface is not decisive for the adhesion of the DLC. As a matter of fact, for nitrogen proportions (N/Cr) that are similar (Examples 9, 12 and 13), the adhesion may be judged good or not good. A relatively strong presence of nitrogen may adversely affect the adhesion, as in Example 11. The absence of nitrogen may lead to good adhesion (Examples 4 to 6, 14 and 15) or not (Examples 1 to 3, 7, 8).

In contrast, the proportion of chromium relative to silicon proved to be a more decisive factor. A relatively high chromium content relate to the silicon (small Si/Cr) does not appear to be suitable for adhesion (e.g. Examples 1 to 3). A relatively low chromium content relative to silicon (large Si/Cr) does not appear to be suitable for adhesion of the DLC either (e.g. Examples 7 to 8).

Thus, when the ratio of the Si/Cr compositions is comprised between 0.35 and 0.6, all the DLC layers deposited on these sub-layers proved to be adherent (Examples 4, 5, 6, 9, 10, 13, 14 and 15).

To obtain a coating such as described above, vacuum deposition equipment such as described below is used.

The vacuum deposition equipment mainly comprises a chamber, a pumping system, a heating system, which are configured to pump and heat the parts (substrate) and within the chamber, in order to accelerate the desorption of the gases and rapidly obtain a vacuum, considered as being of quality, within the chamber.

The deposition equipment further comprises a substrate carrier, which is suited, from the point of view of geometry, electrical bias and kinematics, to the parts, or to the portion of the parts to coat.

The vacuum deposition equipment also comprises an ionic stripping system configured to bombard the parts (substrates) to coat with argon (Ar) ions, in order to eliminate a passivation layer generally present on metal substrates to coat.

The vacuum deposition equipment also comprises a magnetron cathode, equipped with a chromium target, to generate the chromium-based layers.

Preferably, the ionic stripping system is configured to operate simultaneously with the magnetron cathode. The end of the ionic stripping is thus taken advantage of to pre-sputter the magnetron cathode equipped with a chromium target.

For example, the plasma source such as that described in document FR 2 995 493 may be implemented to perform effective ionic stripping of the parts to coat and coat them with a DLC coating of a-C:H type.

The step of depositing the sub-layer is for example configured to produce a sub-layer having a composition such as described above.

The step of depositing the sub-layer is for example configured furthermore to produce a sub-layer having a thickness such as described above.

In an example of implementation, the method may optionally comprise a step of depositing metallic chromium, for example a step of sputtering chromium. Optionally, this step of depositing metallic chromium comprises a step of introducing nitrogen simultaneously with the step of sputtering chromium so as to obtain a layer of chromium nitride, for example CrN or $Cr_2N$ or any intermediate compound.

Such a chromium-based layer, optionally with nitrogen, is deposited with a thickness of a few tenths of a micrometer, as described above.

The deposition continues with the introduction of an organosilicon gas, that is to say a gas carrying at least silicon, typically tetramethylsilane (also called TMS, of formula $Si(CH_3)_4$, which may include traces of oxygen) which is the easiest to implement, or a mixture of silane and a hydrocarbon. Without being exclusive, TMS is by far used preferentially for its relatively high chemical stability and its high volatility enabling easy implementation for it by means of a mass flow meter.

In case of prior deposition of a chromium based layer (Cr, and/or CrN or $Cr_2N$), the organosilicon gas is introduced at increasing rate up to a flow rate at which the silicon content of the sub-layer is at least equal to approximately 0.35 times its chromium content and at most approximately 0.60 times the chromium content in the vicinity of the interface. The ratio of the carbon content to the silicon content is in parallel comprised between 2.5 and 3.5 in the vicinity of the interface.

When a chromium-based layer with nitrogen is used, the quantity of nitrogen injected may be gradually reduced when the quantity of organosilicon gas increases. The quantity of nitrogen is not necessarily brought to 0 but must become notably less than that of organosilicon gas. The nitrogen introduced to produce a layer of CrN (or $Cr_2N$) may also be abruptly brought down to 0 before introducing the organosilicon precursor. Nevertheless, the progressive reduction in the nitrogen is a preferred embodiment since it enables progressive transition of nitrogen in the sub-layer.

By way of example, considering a layer of CrN, N/Cr then has the value for example of 1 and thus the quantity of nitrogen is possibly considered excessive. Considering a layer of $Cr_2N$, N/Cr then has the value for example 0.5 and in such a case, this ratio may be kept.

During the production of the various thin layers under a vacuum described above (chromium-based layer, sub-layer or for instance DLC coating), the bias voltage of the substrate carrier is generally situated between −50 V and −100 V (volt).

The partial pressure of argon during the deposition of these layers is preferably situated between 0.2 Pa and 0.4 Pa.

When the flow rate of organosilicon gas has reached the required level, the electrical supply of the magnetron cathode is cut, the reactive gases (that is to say the organosilicon gas, or the organosilicon gas and the nitrogen according to the case) are stopped. The argon flow, where provided, is reduced to a low value or even brought to 0, and the acetylene is introduced to begin the deposition of the a-C:H coating using the plasma source as described in document FR 2 995 493. The voltage for acceleration of the ions onto the parts is set to enable the desired characteristics of the a-C:H deposition to be obtained. The higher the absolute voltage, the harder the a-C:H deposition will be, according to the rules of the art.

The invention claimed is:

1. Part comprising a metal substrate, a hydrogenated amorphous carbon coating, of a-C:H type, coating the substrate, and a sub-layer based on chromium (Cr), carbon (C) and silicon (Si) disposed between the metal substrate and the amorphous carbon coating and on which the amorphous carbon coating is applied, wherein the sub-layer comprises the following atomic ratios at its interface with the amorphous carbon coating:
a ratio between the silicon content and the chromium content (Si/Cr) comprised between 0.35 and 0.60, and
a ratio between the carbon content and the silicon content (C/Si) comprised between 2.5 and 3.5.

2. The part according to claim 1, wherein the ratio between the silicon content (Si) and the chromium content (Cr) (Si/Cr) of the sub-layer is comprised between 0.38 and 0.6.

3. The part according to claim 1, wherein the ratio between the carbon content (C) and the silicon content (Si) (C/Si) of the sub-layer is comprised between 2.8 and 3.2, or even between 2.9 and 3.1.

4. The part according to claim 1, wherein the sub-layer further comprises atoms of nitrogen (N), a ratio between the nitrogen content and the chromium content (N/Cr) being less than 0.70 at the interface between the sub-layer and the amorphous carbon coating.

5. The part according to claim 4, wherein the ratio between the nitrogen content and the chromium content (N/Cr) is comprised between 0.26 and 0.70 and the ratio between the silicon content and the chromium content (Si/Cr) is comprised between 0.40 and 0.55 at the interface between the sub-layer and the amorphous carbon coating.

6. The part according to claim 1, wherein the sub-layer has a thickness equal to or less than 1.1 µm.

7. The part according to claim 1, wherein the amorphous carbon coating has a thickness equal to or greater than 0.3 µm, or even than 0.5 µm, or possibly even than 1 µm.

8. The part according to claim 1, wherein the amorphous carbon coating has a thickness comprised between 1.5 µm and 3.5 µm.

9. The part according to claim 1, further comprising a chromium-based layer, deposited on the substrate and on which the sub-layer is formed, the chromium-based layer being a layer of chromium (Cr) and/or a layer of chromium nitride.

10. The part according to claim 1, wherein the chromium-based layer has a thickness equal to or less than 1 µm.

11. The part according to claim 2, wherein the ratio between the carbon content (C) and the silicon content (Si) (C/Si) of the sub-layer is comprised between 2.8 and 3.2, or even between 2.9 and 3.1.

12. The part according to claim 2, wherein the sub-layer further comprises atoms of nitrogen (N), a ratio between the nitrogen content and the chromium content (N/Cr) being less than 0.70 at the interface between the sub-layer and the amorphous carbon coating.

13. The part according to claim 3, wherein the sub-layer further comprises atoms of nitrogen (N), a ratio between the nitrogen content and the chromium content (N/Cr) being less than 0.70 at the interface between the sub-layer and the amorphous carbon coating.

14. The part according to claim 1, wherein the sub-layer has a thickness comprised between 0.2 µm and 1.1 µm.

15. The part according to claim 1, wherein the sub-layer has a thickness comprised between 0.3 µm and 0.6 µm.

16. The part according to claim 2, wherein the amorphous carbon coating has a thickness equal to or greater than 0.3 µm, or even than 0.5 µm, or possibly even than 1 µm.

17. The part according to claim 3, wherein the amorphous carbon coating has a thickness equal to or greater than 0.3 µm, or even than 0.5 µm, or possibly even than 1 µm.

18. The part according to claim 4, wherein the amorphous carbon coating has a thickness equal to or greater than 0.3 µm, or even than 0.5 µm, or possibly even than 1 µm.

19. The part according to claim 5, wherein the amorphous carbon coating has a thickness equal to or greater than 0.3 µm, or even than 0.5 µm, or possibly even than 1 µm.

20. The part according to claim 6, wherein the amorphous carbon coating has a thickness equal to or greater than 0.3 µm, or even than 0.5 µm, or possibly even than 1 µm.

* * * * *